(12) United States Patent
Brown et al.

(10) Patent No.: US 7,298,396 B2
(45) Date of Patent: Nov. 20, 2007

(54) APPARATUS AND METHOD FOR MONITORING TRANSMISSION SYSTEMS USING EMBEDDED TEST SIGNALS

(75) Inventors: Jeffrey M. Brown, Windham, ME (US); Andre J. Skalina, Portland, ME (US)

(73) Assignee: SPX Corporation, Charlotte, NC (US)

( * ) Notice: Subject to any disclaimer, the term of this patent is extended or adjusted under 35 U.S.C. 154(b) by 342 days.

(21) Appl. No.: 10/646,846

(22) Filed: Aug. 25, 2003

(65) Prior Publication Data

US 2005/0054301 A1 Mar. 10, 2005

(51) Int. Cl.
H04N 1/00 (2006.01)
H04N 7/00 (2006.01)
H04N 17/00 (2006.01)
H04N 17/02 (2006.01)
H04N 5/00 (2006.01)
H04N 5/38 (2006.01)
H04B 3/46 (2006.01)
H04B 17/00 (2006.01)
H03C 1/62 (2006.01)

(52) U.S. Cl. ............ 348/181; 348/180; 348/192; 348/193; 348/614; 348/723; 375/224; 375/285; 375/347; 455/67.14; 455/68; 455/115.1; 455/115.2

(58) Field of Classification Search ........... 455/67.14, 455/68, 69, 115.1, 115.2, 226.3, 226.4; 348/180–181, 348/192–193, 723–724, 614; 375/316, 347, 375/224, 285

See application file for complete search history.

(56) References Cited

U.S. PATENT DOCUMENTS 3,651,403 A   3/1972  Fluck, Jr. ............ 325/31
5,416,623 A   5/1995  Dawson et al. ......... 359/110
5,481,316 A * 1/1996  Patel .................. 348/614
5,585,842 A  12/1996  Chappell et al. ........ 348/192
5,774,193 A * 6/1998  Vaughan ............... 348/723
5,878,086 A * 3/1999  Hulyalkar .............. 375/285
5,881,362 A * 3/1999  Eldering et al. ........ 725/125
5,881,363 A * 3/1999  Ghosh et al. ........... 725/125
6,212,286 B1 * 4/2001  Rott et al. ............. 382/100
6,246,444 B1 * 6/2001  Kim ................... 348/614
6,278,485 B1 * 8/2001  Franchville et al. .... 348/192

(Continued)

FOREIGN PATENT DOCUMENTS

EP    0 902 385    3/1999

(Continued)

*Primary Examiner*—Brian P. Yenke
(74) *Attorney, Agent, or Firm*—Baker & Hostetler LLP

(57) ABSTRACT

A monitoring system for an RF transmission system, such as a multi-channel television broadcasting antenna feed system, gathers data about the physical and electrical condition of the RF transmission system in real time. The system can detect and localize deterioration and other time-dependent faults in the transmission system by the tendency of faults to produce reflections back to the transmitter that were not part of the original characterization of the installation. Some kinds of faults, identified early enough, can be corrected without replacing components, and especially without shutting down the transmission system during prime viewing hours in the case of television broadcasters, or during a critical period of use of the system in the case of other user types. Other faults can be detected in time to order replacement parts before the underlying problem becomes severe, and to allow servicing during periods of low demand.

18 Claims, 3 Drawing Sheets

U.S. PATENT DOCUMENTS

| | | | |
|---|---|---|---|
| 6,281,935 B1 * | 8/2001 | Twitchell et al. | 348/470 |
| 6,356,742 B1 * | 3/2002 | Fries | 455/91 |
| 6,424,216 B2 * | 7/2002 | Mu et al. | 330/207 P |
| 6,433,835 B1 * | 8/2002 | Hartson et al. | 348/608 |
| 6,501,804 B1 * | 12/2002 | Rudolph et al. | 375/285 |
| 6,912,247 B2 * | 6/2005 | Miyashita et al. | 375/228 |
| 6,917,389 B2 * | 7/2005 | Lee | 348/608 |
| 7,015,948 B2 * | 3/2006 | Skalina | 348/180 |
| 7,034,545 B2 * | 4/2006 | Brown et al. | 324/538 |
| 2003/0142017 A1 | 7/2003 | Rabinowitz et al. | 342/458 |
| 2004/0192209 A1 * | 9/2004 | Muterspaugh | 455/65 |
| 2005/0190830 A1 * | 9/2005 | Miyashita et al. | 375/228 |

FOREIGN PATENT DOCUMENTS

| | | |
|---|---|---|
| WO | WO 99/38023 | 7/1999 |
| WO | WO 01/15001 | 3/2001 |
| WO | WO 03/088683 | 10/2003 |

\* cited by examiner

APPARATUS AND METHOD FOR MONITORING TRANSMISSION SYSTEMS USING EMBEDDED TEST SIGNALS

FIELD OF THE INVENTION

The present invention relates generally to radio frequency transmission systems. More particularly, the invention relates to continuous monitoring of the condition of transmission systems.

BACKGROUND OF THE INVENTION

It is known in radio frequency systems to use a coaxial or waveguide transmission system to propagate radio frequency (RF) signals from place to place, such as from a broadcast transmitter to a broadcast antenna.

A disadvantage of systems in current use is that a waveguide or coaxial transmission system consisting of a transmission line and a load device can deteriorate gradually due to its exposure to a number of destructive factors, while the deterioration can continue undetected in normal use until a catastrophic failure reveals one or more problems. Since a transmission system may be used, for example, for broadcast of several television channels using a shared, broad-band antenna system, it is possible for a multiplicity of channel transmissions to be rendered inoperable or degraded to a significant extent for an extended time interval until repair parts can be procured and installed.

Destructive factors likely to contribute to harm to transmission systems over periods of months or years can include, as examples, galvanic corrosion; cold flow under bolts caused by repeated temperature swings; metal fatigue associated with repeated mechanical stress cycling; exposure to chemically reactive pollutants; exposure to airborne salt; exposure to water condensed inside the transmission system due to temporary loss of pressurization or dehumidification; and hidden workmanship errors such as pinched O-rings or pinhole flaws in the materials from which the transmission system is constructed.

These and many other factors can lead to significant increases in voltage standing wave ratio (VSWR) at a point, high voltage breakdown, and other faults demanding immediate attention. VSWR increases stemming from such destructive events can manifest suddenly due to events such as storm stress on deteriorated materials, or can manifest gradually in the form of cumulative degradation in performance over a protracted period. Both problem modalities can require extensive efforts simply to identify and localize a single-point failure even after it has occurred. Multiple-point degradations can likewise become established, requiring prolonged and potentially ineffective troubleshooting.

A typical operator response to prevent some types of severe functional faults from continuing to grow worse is prompt decrease in output power, resulting in loss of reception for the furthest customers and degraded reception for those nearer. Even this response is not diagnostic, so it is still necessary to identify the failure that caused the system fault. A time consuming diagnostic procedure can ensue, leading to the development of a corrective action plan, which may involve shutting down a multi-channel broadcast facility for an extended period during prime viewing hours, switching over to a reduced-performance backup system for an indefinite servicing period, or another method, any of which can potentially entail significant contract violations and incur financial penalties.

A transmitted RF test signal in the form of a particular embedded data pattern is specified by the Federal Communications Commission (FCC) as mandatory for National Television Standards Committee (NTSC) television, the 525-line, 30-interlaced-frames per second standard used in North and South America, Japan, Taiwan, and some other countries. The mandatory test pattern has been inserted into the signal in order to allow an analytical device in a television receiver to identify and eliminate so-called ghost images caused by reflections of a program channel that arrive later than the direct-path signal for that channel. While the Ghost Cancellation Reference signal (GCR) is available for use in receivers, no methodology has been established for incorporating GCR into a high-power NTSC RF broadcast transmission system for real-time analysis of the state of health of the transmission system. Similarly, no existing system has been established for realtime testing of non-broadcast applications.

Accordingly, there is a need for a detective and diagnostic apparatus and method that can be applied continuously to provide prompt detection of degradation taking place in an RF transmission system, to include identification of the locus of each of an indefinite number of incipient failures.

SUMMARY OF THE INVENTION

The foregoing needs are met, at least to a great extent, by the present invention, which in some embodiments provides a detective and diagnostic apparatus and method that can be applied continuously to provide prompt detection of degradation taking place in an RF transmission system, to include identification of the locus of each of an indefinite number of incipient failures.

In accordance with one embodiment of the invention, an RF signal transmission system comprises a transmission system capable of carrying RF signals from a source site to a destination site; a combining system to pass RF signals from a source site, wherein the combining system is located proximate to one end of the transmission system, and wherein the combining system provides as an electrical output RF signals that have been reflected from loci within the transmission system; and a signal source to produce a test signal, wherein the test signal is a signal embedded within an RF signal stream fed into the transmission system at the source site.

In accordance with another embodiment of the invention, a combined RF signal transmission and test apparatus comprises means for directing an RF signal from an RF signal source to an RF load; means for producing a test signal embedded within the stream of an RF signal; and means for detecting energy from an RF signal reflected back from said signal directing means and said RF load.

In accordance with yet another embodiment of the invention, a method of testing an RF transmitting apparatus comprises the steps of transmitting an RF signal that includes an integral RF test signal into an RF transmission system; receiving reflections, if present, of the RF test signal from the RF transmission system with a combining system located proximate to the end of the transmission system at which the transmitter is located; processing the received reflections to establish a first pattern of time intervals and magnitudes from the original RF test signal to each reflection; and comparing the first pattern of time intervals and magnitudes of received reflections to a second pattern of time intervals and magnitudes measured at some different point in time.

There have thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods, and systems for carrying out the several purposes of the present invention. It is important, therefore, that the claims be regarded as including such equivalent constructions insofar as they do not depart from the spirit and scope of the present invention.

DETAILED DESCRIPTION OF THE INVENTION

In accordance with some embodiments, the present invention provides a detective and diagnostic apparatus and method that can be applied continuously to provide prompt detection of degradation taking place in an RF transmission system, to include identification of the locus of each of an indefinite number of incipient failures.

In accordance with some embodiments of the invention, a sensing apparatus detects the fine detail of radio frequency (RF) reflections from a transmission system due to the impingement of a transmitted RF test signal embedded in the program content of a transmitted channel. The signal can be used to measure some of the characteristics of an RF signal transmission system. Some of the characteristics of the transmission system can be recorded, and measurements taken at any subsequent time, such as minutes, hours, months or years later, can be compared to the original recordings to detect gradual changes in the propagation capability of the system, with each increment of length of the RF signal transmission system characterized both when new and when periodically recharacterized. If warning thresholds are established, then the test system can be configured to alert the operators when the system exhibits evidence of degradation but before the system fails catastrophically, thereby potentially minimizing damage and permitting servicing to be performed at a time of the users' choosing.

Figure 1:
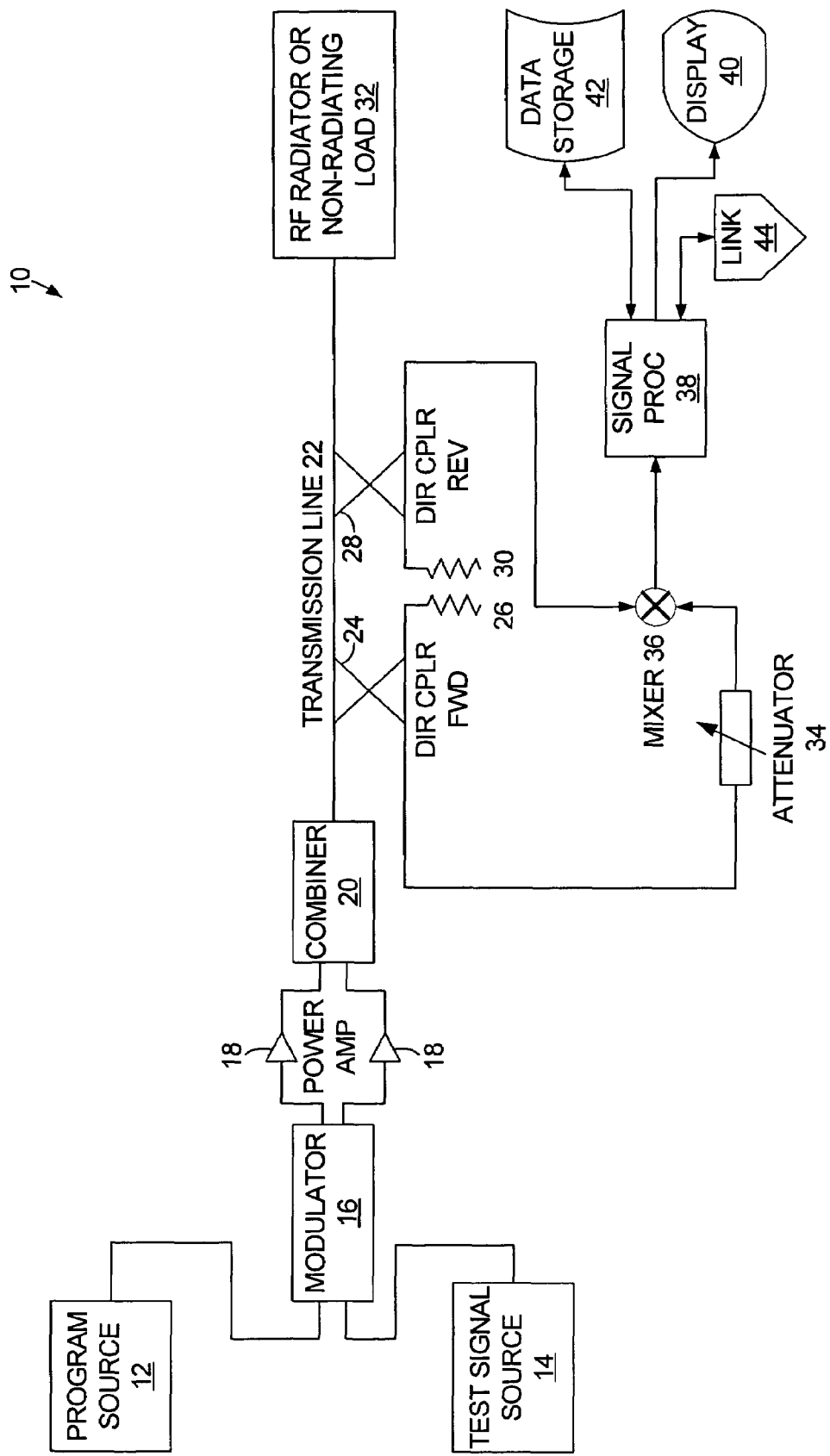
FIG. 1 is a schematic diagram of a signal transmission system incorporating a preferred embodiment of the detection system.

In one aspect of the inventive apparatus and method, as shown in schematic diagram form in FIG. 1, an RF broadcast system 10 using a transmission system comprises a program source 12, such as one or more continuous, low-power signals from a television studio, each of which may have audio and video; a test signal source 14, that embeds the GCR signal into the waveform; an RF modulator, that applies an RF carrier to the baseband signal; one or more amplifiers 18; sufficient combiners 20 to collect the signals from all of the amplifiers 18 into a single, high-level signal for broadcast; a transmission system 22 to carry the signals to a load such as an antenna 32 that can radiate the broadcast signals so generated.

To this system the preferred embodiment can add a forward directional coupler 24 to tap the primary signal, with a forward load 26 to dissipate waste energy; a reverse directional coupler 28 to tap reflections, with a reverse load to dissipate waste energy; an attenuator 34 to match the signal levels between the forward and reverse couplers, 24 and 28, respectively; a mixer 36 to cause substantially all of the primary signal energy in the two signal paths to be canceled, leaving only the reflected signals to be detected; and a signal processing subsystem 36 that identifies each time-delayed, and thus reflected, signal component and translates that signal into a representation of the distance from the couplers to the reflection-causing artifact in the transmission system 22. The output of the signal processing subsystem 38 can include data display 40, data storage 42, and data handling 44 for examination, storage, comparison between test events separated in time, and communication with outside resources such as remote processing systems.

Figure 2:
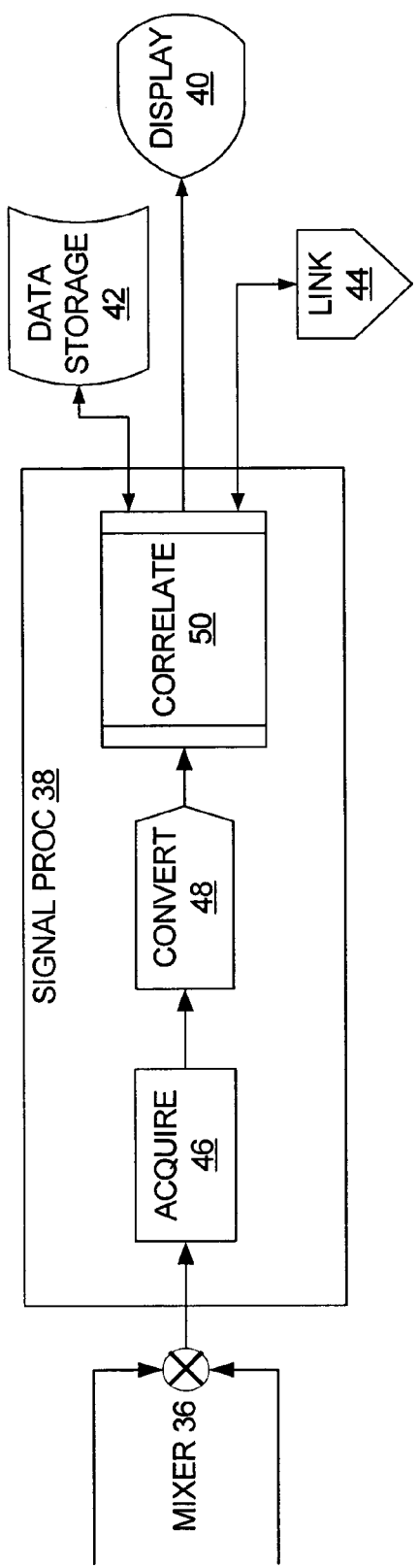
FIG. 2 is a schematic diagram of a signal processing subsystem of an RF signal transmission system incorporating an embodiment of the detection system.

FIG. 2 shows, in schematic diagram form, one embodiment of a transmission system monitoring subsystem. The signal processing subsystem 38 can include functions of acquiring 46 the received RF signals, digitizing 48 the received signals, and performing a correlation function 50 to distinguish reflections from random noise. Reflected signal properties can show both timing and strength of a reflection, corresponding to the location and severity, respectively, of an impedance mismatch in a transmission system 22.

Figure 3:
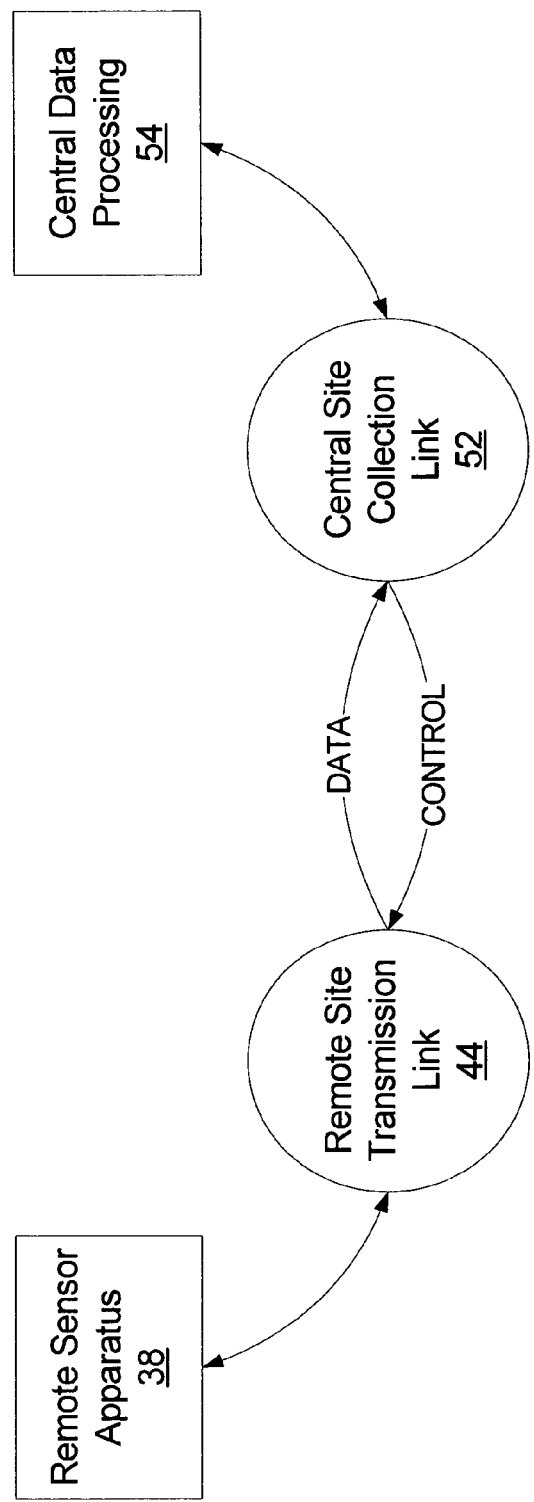
FIG. 3 is a node diagram illustrating interconnection supporting a central clearinghouse for transmission system status information.

FIG. 3 shows that a signal processing subsystem 38 can acquire data concerning a transmission system 22 of FIG. 1 and telemeter that data 44 to another location 52, where the data can be processed 54 for further use. An example of such another location is a central clearinghouse where information concerning one or more transmission systems can be processed and stored, where periodic reports can originate to inform users of the status of the transmission system or systems, and where support services such as repair part orders and work orders can originate. Such a clearinghouse may in some embodiments permit broader analysis, such as failure patterns in individual device types, to be accomplished. As shown in FIGS. 2 and 3, the central location can also, in some embodiments, transmit commands, such as instructions to the test apparatus, for the control of activities at the remote sites.

In some embodiments, the test system can compare the waveform incident on the RF transmission system to the succession of reflections both from mismatches at junctions connecting line sections and from damage to the line between junctions, as might occur from ice, wind-blown object impact, salt corrosion, or other mechanical or electrical failure.

A particular analog swept-frequency signal embedded in the blank interval of an NTSC analog television signal is recognized by the FCC as a standard test signal that can be used by specialized circuitry within NTSC receivers for multipath distortion compensation in television systems. This NTSC-recognized, calibrated RF pulse can be identified by its presence in a specific line in the blank interval between frames and by its distinctive rising-frequency waveform. Analytical circuitry can detect signal reflections by using a correlation coefficient or other comparison function to identify each of what may be a succession of occurrences of waveform coincidence between the characteristic NTSC test signal and delayed copies of the test signal reflected from joints and other mismatches in the transmission system.

In some embodiments, the inventive apparatus may not apply to the antenna or other load device. The inventive apparatus still may be employed to monitor the condition of the transmission line only.

The directionality of the combining system used to receive the reflections of the test element of the NTSC RF signal can in some embodiments largely block the much stronger outgoing signal. This can enhance the sensitivity of the receiving apparatus to the reflected signals.

The embodiments herein are described in terms most directly applicable to the use of coaxial lines, but in many instances waveguide can be used for a greater or lesser portion of the signal paths indicated. Particularly for systems in which ultra-high frequency (UHF) transmissions at moderate to high power are required, the process described can enable an effective system realization with either coaxial lines or waveguides.

Other classes of transmission systems aside from the waveguides and rigid coaxial lines used for high-power RF broadcast signal transmission can employ embodiments of this inventive apparatus. The concept may be applied to open-line transmission systems, such as those used in short wave radio transmission. Open trough transmission systems likewise have known and defined characteristics and in some embodiments can be monitored.

Similarly, the adaptability of the inventive apparatus can extend error detection capability to low-level signals, which in some embodiments may be processed in a manner similar to broadcast-level signals.

Power transmissions and signals of other types, such as those used in radar and other radiating systems as well as cyclotrons, colliders, and other high-energy research instruments, can likewise employ monitoring, record keeping, analysis, and management functions as herein described.

The many features and advantages of the invention are apparent from the detailed specification; thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to that fall within the scope of the invention.

What is claimed is:

1. A radio frequency (RF) signal transmission system, comprising:
   a transmission system configured to carry RF signals from a source site to a destination site;
   a termination RF load, located at said destination site;
   a combining system electrically connected within said transmission system and configured to pass RF signals from said source site, wherein said combining system is located proximate to the a source end of said transmission system, wherein said combining system further comprises a forward directional coupler configured to tap RF signals progressing from said source site, and a reverse directional coupler configured to tap reflected RF signals, and wherein said combining system provides as separate electrical outputs RF signals from said source site and RF signals that have been reflected from loci within said transmission system; and
   a test signal source, wherein a test signal from said test signal source is embedded within an RF signal stream fed into said transmission system from said source site.

2. The RF signal transmission system of claim 1, wherein the test signal from said test signal source is a swept tone within the RF signal stream during a time interval corresponding to a specific horizontal line in an NTSC Television signal stream.

3. The RF signal transmission system of claim 1, wherein said the test signal from said test signal source is an NTSC analog Ghost Canceling Reference Signal (GCR) pattern waveform used for ghost cancellation at a television receive site.

4. The RF signal transmission system of claim 1, further comprising a signal processor to identify RF signals reflected back from irregularities within said transmission system.

5. The RF signal transmission system of claim 1, further comprising a signal processor to identify RF signals reflected back from irregularities within said transmission system, wherein each of the reflected RF signals includes a predetermined, embedded pattern of frequency variation that occurs in a specific line in the blank interval between frames of an NTSC analog television signal, and wherein the pattern within the reflected RF signals occurs at a time coincident at least in part with a pattern that occurred within a previous reflected RF signal.

6. The RF signal transmission system of claim 1, further comprising a signal processor to identify RF signals reflected back from irregularities within the transmission system structure, wherein each of the reflected RF signals includes a predetermined, embedded pattern of frequency variation that occurs in a specific line in the blank interval between frames of an NTSC analog television signal, and wherein the pattern within the reflected RF signals occurs at a time distinct from any previous reflected RF signal.

7. The RF signal transmission system of claim 1, further comprising:
   a data storage medium to capture a record of the response of said transmission system to insertion of a signal source for test; and
   a data analysis apparatus to compare a first response by said transmission system to a second response by said transmission system and identify differences between the response by said transmission system.

8. The RF signal transmission system of claim 1, further comprising:
   a data storage medium to capture an initial record of the response of said transmission system to the presence of normal signals that include a test signal source;
   a data storage medium to capture a subsequent record of the response of said transmission system to the presence of normal signals that include a test signal source; and
   a data analysis apparatus to compare an initial response of said transmission system to a subsequent response of said transmission system and identify changes in the response of said transmission system over time.

9. The RF signal transmission system of claim 1, further comprising:
   a data storage medium to capture a record of the response of said transmission system to insertion of an RF test signal wherein said RF test signal is a telemetry pattern embedded within an RF signal transmitted by the RF signal transmission system; and
   a data analysis apparatus to compare a response of said transmission system to a predetermined response of said transmission system and identify defects in the response of said transmission system.

10. The RF signal transmission system of claim 1, further comprising a warning system that compares a first characterization of an RF transmission system at a first time to a second characterization of the same line at a second time and generates warning signals if the RF transmission system characterization deviates from the first characterization by an amount that exceeds an established threshold.

11. The RF signal transmission system of claim 1, further comprising a remote data gathering system that acquires, by telemetry, a first characterization of an RF transmission system at a first time, acquires, by telemetry, a second characterization of the same RF transmission system from the RF transmission system, stores characterization data for subsequent use, and performs such computation as may be required to analyze the physical condition of the RF transmission system and generate warning signals if the RF transmission system characterization deviates from the first characterization by an amount that exceeds an established threshold.

12. The RF signal transmission system of claim 1, further comprising a remote data gathering system that:
   acquires, by telemetry, a first set of characterization data for a multiplicity of RF transmission systems at a first set of times;
   stores characterization data for subsequent use;
   acquires, by telemetry, a second set of characterizations of the same multiplicity of RF transmission systems at a second set of times;
   performs such computation as may be required to analyze the physical condition of the RF transmission systems; and
   generates a warning signal at such time as a second RF transmission system characterization deviates from the RF transmission system's first characterization by an amount that exceeds an established threshold.

13. A combined RF signal transmission and test apparatus comprising:
   means for directing an RF signal from an RF signal source to an RF load;
   means for producing a test signal embedded within the stream of an RF signal;
   means for coupling a forward-directed portion of the RF signal directed from the RF source to the RF load into a means for detecting the test signal;
   means for coupling a reflected portion of the RF signal, directed back from a source of reflection within the means for directing, toward the RF source, into the means for detecting the test signal; and
   means for comparing times of arrival of the forward-directed and reflected portions of the test signal coupled from the means for directing, within the means for detecting the test signal.

14. The RF signal transmission and test apparatus of claim 13, further comprising:
   means for recording initial propagation characteristics of the means for directing an RF signal;
   means for recording subsequent propagation characteristics of the means for directing an RF signal; and
   means for comparing recorded characteristics acquired at different times.

15. The RF signal transmission and test apparatus of claim 13, further comprising means for recording comparisons between recorded characteristics acquired at different times.

16. The RF signal transmission and test apparatus of claim 13, further comprising means for displaying results of comparisons between recorded characteristics acquired at different times.

17. The RF signal transmission and test apparatus of claim 13, further comprising means for analyzing differences between recorded characteristics acquired at different times.

18. The RF signal transmission and test apparatus of claim 13, further comprising means for alerting a user to system discrepancies between recorded characteristics acquired at different times.

* * * * *